United States Patent
Nakamura et al.

(10) Patent No.: US 10,836,958 B2
(45) Date of Patent: Nov. 17, 2020

(54) WAVELENGTH CONVERSION MEMBER

(71) Applicant: Panasonic Intellectual Property Management Co., Ltd., Osaka (JP)

(72) Inventors: Masahiro Nakamura, Osaka (JP); Tatsuya Okuno, Osaka (JP); Youshin Lee, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 111 days.

(21) Appl. No.: 16/092,453

(22) PCT Filed: Apr. 10, 2017

(86) PCT No.: PCT/JP2017/014618
§ 371 (c)(1),
(2) Date: Oct. 10, 2018

(87) PCT Pub. No.: WO2017/179521
PCT Pub. Date: Oct. 19, 2017

(65) Prior Publication Data
US 2019/0169494 A1  Jun. 6, 2019

(30) Foreign Application Priority Data

Apr. 12, 2016 (JP) .................................. 2016-079354

(51) Int. Cl.
*C09K 11/02* (2006.01)
*C09K 11/08* (2006.01)
(Continued)

(52) U.S. Cl.
CPC .............. *C09K 11/02* (2013.01); *C09K 11/08* (2013.01); *C09K 11/7706* (2013.01); *G02B 5/20* (2013.01); *H01L 33/50* (2013.01); *C23C 24/00* (2013.01)

(58) Field of Classification Search
CPC ..... C09K 11/02; C09K 11/08; C09K 11/7706; H01L 33/50; G02B 5/20; C23C 24/00
See application file for complete search history.

(56) References Cited

U.S. PATENT DOCUMENTS

2002/0064682 A1\* 5/2002 Yano ................... C09K 11/7731
428/690
2004/0048068 A1\* 3/2004 Yano ................... C09K 11/7729
428/411.1
(Continued)

FOREIGN PATENT DOCUMENTS

EP     3428697 A1    1/2019
JP     2003-243727 A  8/2003
(Continued)

OTHER PUBLICATIONS

Extended European Search Report, corresponding Application No. 17782334.1, dated Feb. 14, 2019.
(Continued)

*Primary Examiner* — Nathan L Van Sell
(74) *Attorney, Agent, or Firm* — Renner, Otto, Boisselle & Sklar, LLP

(57) ABSTRACT

A wavelength conversion member includes: a substrate; and a wavelength converter that converts color of incident light, the wavelength converter being provided on a surface of the substrate. The wavelength converter has: inorganic phosphor particles which convert the color of the incident light; and a binder layer that fixes the inorganic phosphor particle to one another, the binder layer including at least one type of metal oxides with a melting point of 800° C. or less. The substrate and the wavelength converter are fixed to each other by the binder layer of the wavelength converter.

3 Claims, 6 Drawing Sheets

(51) Int. Cl.
*G02B 5/20* (2006.01)
*H01L 33/50* (2010.01)
*C09K 11/77* (2006.01)
*C23C 24/00* (2006.01)

(56) References Cited

U.S. PATENT DOCUMENTS

| | | |
|---|---|---|
| 2008/0187746 A1 | 8/2008 | De Graaf et al. |
| 2008/0251808 A1* | 10/2008 | Kususe .................. H01L 24/06 257/98 |
| 2009/0243478 A1* | 10/2009 | Shoda ................ H01L 51/5048 313/504 |
| 2010/0032697 A1* | 2/2010 | Nagai ................... H01L 33/641 257/98 |
| 2012/0025256 A1* | 2/2012 | Kususe .................. H01L 24/06 257/98 |
| 2013/0257264 A1 | 10/2013 | Tamaki |
| 2014/0284644 A1 | 9/2014 | KIrai |

FOREIGN PATENT DOCUMENTS

| | | |
|---|---|---|
| JP | 5090549 B | 9/2012 |
| JP | 2013-247067 A | 12/2013 |
| JP | 2014-187147 A | 10/2014 |
| JP | 2014-201726 A | 10/2014 |
| JP | 2015-38960 A | 2/2015 |

OTHER PUBLICATIONS

International Search Report for corresponding App. No. PCT/JP2017/014618, dated Jun. 13, 2017.
Written Opinion for corresponding App. No. PCT/JP2017/014618, dated Jun. 13, 2017.

* cited by examiner

WAVELENGTH CONVERSION MEMBER

TECHNICAL FIELD

The present invention relates to a wavelength conversion member using photoluminescence, and particularly, relates to a wavelength conversion member excellent in heat resistance and heat dissipation even when irradiated with high-power excitation light and capable of being fired at low temperature.

BACKGROUND ART

Heretofore, as a wavelength converter using photoluminescence, there has been known a wavelength converter composed of: a plurality of phosphor particles which emit light by being irradiated with excitation light; and a binder that holds the plurality of phosphor particles. Specifically, a wavelength converter in which silicon resin is filled with a phosphor has been known. For example, the wavelength converter has a form of a layered or plate-shaped body formed on a metal substrate. In this description, a member including the substrate and the wavelength converter is referred to as a wavelength conversion member.

In recent years, the wavelength conversion member has been required to increase power of excitation light in order to enhance a light output. Therefore, for the wavelength conversion member, high-power excitation light of a laser light source or the like has been being used as the excitation light. However, an organic binder such as silicon resin is poor in heat resistance and heat dissipation. Therefore, when the wavelength conversion member having the organic binder is irradiated with the high-power excitation light of the laser light source or the like, an organic substance that composes the binder is discolored and burnt to decrease light transmittance of the wavelength conversion member, whereby light output efficiency of the wavelength conversion member is prone to decrease. Moreover, when the wavelength conversion member having the organic binder is irradiated with the high-power excitation light of the laser light source or the like, the wavelength conversion member generates heat since thermal conductivity of the organic substance is usually as low as less than 1 W/m·K. As a result, the wavelength conversion member having the organic binder is prone to cause temperature quenching of the phosphor.

CITATION LIST

Patent Literature

Patent Literature 1: Japanese Patent No. 5090549
Patent Literature 2: Japanese Unexamined Patent Application Publication No. 2015-38960

SUMMARY OF INVENTION

Technical Problem

For the above, Patent Literature 1 discloses a wavelength converter obtained by using and sintering a ceramic material, which has high heat resistance, heat dissipation and visible light transmittance, an organic binder such as silicon resin, and a phosphor. Formation of this wavelength converter on a substrate obtains the wavelength conversion member. The wavelength converter of Patent Literature 1 is manufactured by performing the sintering, for example, at a temperature as high as approximately 1200° C. However, the wavelength converter of Patent Literature 1 has had a problem of low productivity of the wavelength converter and the wavelength conversion member using the same due to the sintering at the high temperature. Moreover, in the (Sr,Ca)AlSiN$_3$:Eu (CASN) phosphor that is a phosphor excellent in color rendering and widely used as a phosphor for a white LED, an oxidation reaction occurs under a high-temperature environment, and a luminance maintenance factor is prone to significantly decrease. Therefore, the wavelength converter of Patent Literature 1, which is subjected to the sintering at a high temperature, has had a problem that it is difficult to enhance the color rendering of the obtained wavelength conversion member since the CASN phosphor in which the oxidation reaction occurs under a high-temperature environment cannot be used.

Moreover, Patent Literature 2 discloses a method for manufacturing a wavelength converter, a wavelength conversion member using the wavelength converter and a light emitting device using the wavelength converter, by using a phosphor and a binder composed of a silica-based material or a precursor thereof, and by fixing particles of the phosphor to one another by the binder cured by being heated to 500° C. or less. However, in comparison with other metal oxides, silica usually has thermal conductivity as low as less than 1 W/m·K, and accordingly, the method in Patent Literature 2 has had a problem that the heat dissipation of the wavelength converter and the wavelength conversion member and the light emitting device, both using the wavelength converter, is poor.

Note that, in order to solve these problems, there is proposed a wavelength converter including: a plurality of phosphor particles; and a binder layer that adheres the plurality of adjacent phosphor particles to one another, the binder layer being composed of a nanoparticle-fixed body in which a plurality of nanoparticles having an average particle size D$_{50}$ of 1 nm or more and less than 100 nm are adhered to one another. However, a wavelength conversion member obtained by forming this wavelength converter on a substrate has insufficient adhesion strength of the binder layer that fixes the substrate and the phosphor particles of the wavelength conversion member to each other, and accordingly, has had a problem that the substrate and the wavelength converter may be peeled off from each other. As described above, heretofore, no wavelength conversion member has been known, which is excellent in heat resistance and heat dissipation even when irradiated with the high-power excitation light, has high adhesion between the substrate and the wavelength converter, and is capable of being fired at low temperature.

The present invention has been made in consideration of the above problems. It is an object of the present invention to provide a wavelength conversion member that is excellent in heat resistance and heat dissipation even when irradiated with the high-power excitation light, has high adhesion between the substrate and the wavelength converter, and is capable of being fired at low temperature.

Solution to Problem

In order to solve the above-described problems, a wavelength conversion member according to an aspect of the present invention includes: a substrate; and a wavelength converter that converts color of incident light, the wavelength converter being provided on a surface of the substrate. The wavelength converter has: inorganic phosphor particles which convert the color of the incident light; and a binder layer that fixes the inorganic phosphor particles to one another, the binder layer including at least one type of metal oxide with a melting point of 800° C. or less. The substrate and the wavelength converter are fixed to each other by the binder layer of the wavelength converter.

DESCRIPTION OF EMBODIMENTS

[Wavelength Conversion Member]

Figure 1:
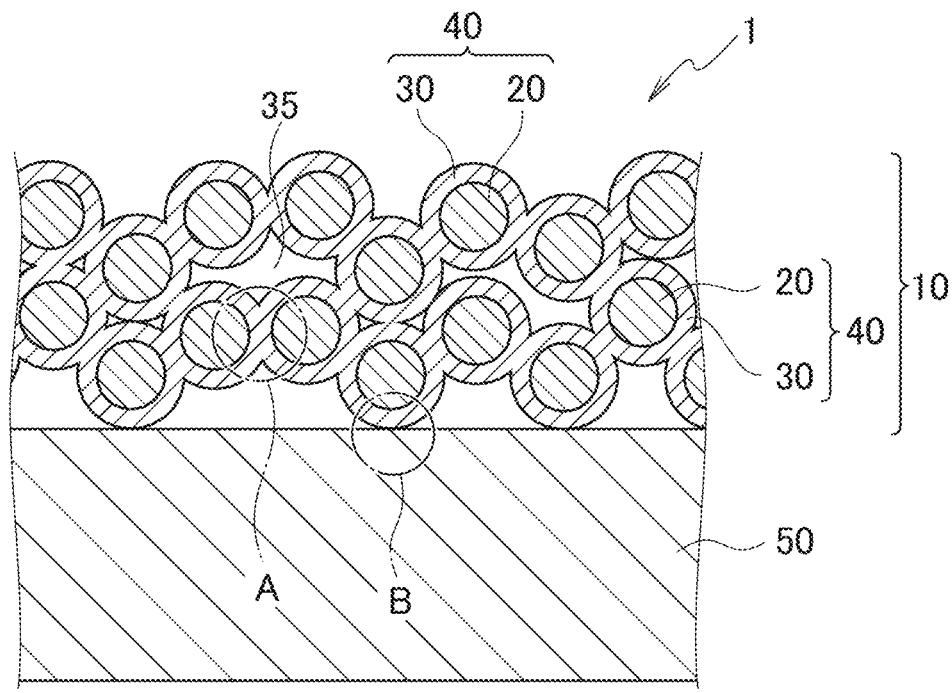
FIG. 1 is a schematic cross-sectional view of a wavelength conversion member according to a first embodiment.

Hereinafter, a wavelength conversion member according to an embodiment will be described with reference to the drawings. The wavelength conversion member 1 according to this embodiment includes a substrate 50 and a wavelength converter 10, and the wavelength converter 10 has inorganic phosphor particles 20 and a binder layer 30. Moreover, in the wavelength conversion member 1, the substrate 50 and the wavelength converter 10 are fixed to each other by the binder layer 30 of the wavelength converter 10.

A plurality of embodiments shown below are embodiments different in configuration of the binder layer 30. A form of the binder layer 30 includes forms such as a nanoparticle-fixed body and a bulk body.

First Embodiment

FIG. 1 is a schematic cross-sectional view of a wavelength conversion member according to a first embodiment. A wavelength conversion member 1 according to the first embodiment is an embodiment in which the binder layer 30 is a nanoparticle-fixed body.

As shown in FIG. 1, the wavelength conversion member 1 according to the first embodiment includes: a substrate 50; and a wavelength converter 10 that converts color of incident light, the wavelength converter 10 being provided on a surface of the substrate 50. Moreover, the wavelength converter 10 has: inorganic phosphor particles 20 which convert the color of the incident light; and the binder layer 30 that fixes the inorganic phosphor particles 20 to one another. The substrate 50 and the wavelength converter 10 are fixed to each other by the binder layer 30 of the wavelength converter 10.

<Substrate>

The substrate 50 is a substrate that supports the wavelength converter 10. The substrate 50 adheres to the wavelength converter 10 by being fixed to the binder layer 30 that composes the wavelength converter 10. Note that the fact that the wavelength converter 10 is provided on the surface of the substrate 50 means that the wavelength converter 10 is directly or indirectly provided on the surface of the substrate 50. In the first embodiment, as shown ion FIG. 1 and FIG. 3, the wavelength converter 10 is directly provided on the surface of the substrate 50.

However, in another embodiment, a member that is excellent in adhesion to the substrate 50 and is fixed to the binder layer 30 of the wavelength converter 10 can be provided between the substrate 50 and the wavelength converter 10. As such a member, for example, a metal thin film, an oxide thin film, or a member formed combining these films is used. In the other embodiment in which such a member is provided between the substrate 50 and the wavelength converter 10, the wavelength converter 10 is indirectly provided on the surface of the substrate 50.

A material of the substrate 50 is not particularly limited. However, for example, a transparent substrate such as a glass substrate, a metal substrate such as a copper substrate and a stainless-steel substrate, a ceramic substrate such as an AlN substrate, or the like is used. If the substrate 50 is a metal substrate among them, then the substrate 50 is generally made of metal having higher thermal conductivity than ceramics. Accordingly, this is preferable since heat generated in the wavelength converter 10 made of ceramics can be radiated efficiently. Moreover, if the substrate 50 is a ceramic substrate, then this is preferable since a difference in thermal expansion coefficient between the substrate 50 and the wavelength converter 10 is reduced to make it difficult to peel off the substrate 50 and the wavelength converter 10 from each other. Among a plurality of such ceramic substrates, the AlN substrate is more preferable since heat resistance thereof is high. Note that, as will be described later, since both of the inorganic phosphor particles 20 and the binder layer 30 are made of ceramics, the whole of the wavelength converter 10 is composed of ceramics.

Incidentally, metal usually has a larger thermal expansion coefficient than ceramics. Therefore, if a large temperature change occurs in the wavelength conversion member 1 when the substrate 50 is a metal substrate, then a difference in thermal expansion coefficient occurs between the metal substrate 50 and the wavelength converter 10 made of ceramics, and there acts force to peel off both of the metal substrate 50 and the wavelength converter 10 from each other. In contrast, in the wavelength converter 10 of this embodiment, since the binder layer 30 of the wavelength converter 10 contains at least one type of specific nanoparticles 31, the binder layer 30 and the substrate 50 are fixed to each other strongly. Therefore, in this embodiment, such a metal substrate can be used as the substrate 50 since the use of this metal substrate 50 makes it difficult for the metal substrate 50 and the wavelength converter 10 to peel off from each other.

<Wavelength converter>

The wavelength converter 10 is a member that converts color of incident light, the member being provided on the surface of the substrate 50. The wavelength converter 10 has: the inorganic phosphor particles 20 which convert the color of the incident light; and the binder layer 30 that fixes the inorganic phosphor particles 20 to one another. The inorganic phosphor particles 20 in the wavelength converter 10 are excited by the incident light, and radiate light obtained by converting color of the incident light. By this function of the inorganic phosphor particles 20, the wavelength converter 10 develops a function to convert the color of the incident light.

Note that, in the wavelength converter 10 shown in FIG. 1, surfaces of the individual inorganic phosphor particles 20 are covered with the binder layer 30, whereby nanoparticle-covered phosphor particles 40 composed of the phosphor particles 20 and the binder layer 30 are formed. However, in this embodiment, the binder layer 30 just needs to be formed at least to fix the adjacent inorganic phosphor particles 20 to one another and to fix the inorganic phosphor particles 20 and the substrate 50 to each other. Therefore, as another embodiment than the wavelength converter 10 shown in FIG. 1, such a wavelength converter can also be formed, in which the surfaces of the individual inorganic phosphor particles 20 are partially exposed without being covered with the binder layer 30, where the nanoparticle-covered phosphor particles 40 are not formed.

[Inorganic Phosphor Particle]

The inorganic phosphor particles 20 are inorganic particles which convert the color of the incident light. Although not particularly limited, for example, an ultraviolet ray, purple light, blue light and the like can be used as the incident light. The inorganic phosphor particles 20 are excited by the incident light, and radiate the light obtained by converting the color of the incident light.

The inorganic phosphor particles 20 just need to be capable of photoluminescence, and a type thereof is not particularly limited. As the inorganic phosphor particles 20, for example, there are used crystalline particles with a garnet structure made of YAG, that is, $Y_3Al_5O_{12}$, and phosphor particles made of $(Sr,Ca)AlSiN_3$:Eu.

It is preferable that the inorganic phosphor particles 20 contain phosphor particles in which a luminance maintenance rate ($L_2/L_1$) is 80% or less, the luminance maintenance rate ($L_2/L_1$) being obtained by dividing a luminance ($L_2$) of the phosphor particles, which are already burnt at 1200° C. or more in the atmosphere, by a luminance ($L_1$) of the phosphor particles, which are not still burnt at 1200° C. or more in the atmosphere. It is preferable that the phosphor particles 20 contain the phosphor particles in which luminance maintenance factor ($L_2/L_1$) is 80% or less since such a wavelength converter 10 having high color rendering while having high conversion efficiency can be obtained.

A particle size of the inorganic phosphor particles 20 is not particularly limited as long as being a size at which it is possible to fix the inorganic phosphor particles 20 by the binder layer 30.

The inorganic phosphor particles 20 may be made of phosphors having the same composition, or may be a mixture of phosphor particles having two or more types of compositions.

[Binder Layer]

The binder layer 30 is a member that fixes the inorganic phosphor particles 20 to one another by containing at least one type of metal oxide with a melting point of 800° C. or less. The binder layer 30 may be made of only the metal oxide with a melting point of 800° C. or less; however, may contain a substance other than the metal oxide with a melting point of 800° C. or less in addition to the metal oxide with a melting point of 800° C. or less.

In the wavelength conversion member 1 according to the first embodiment, the binder layer 30 is a nanoparticle-fixed body made of only nanoparticles of the metal oxide with a melting point of 800° C. or less. Note that, in a wavelength conversion member 1A according to a second embodiment to be described later, the binder layer 30 is a nanoparticle-fixed body made of nanoparticles containing the substance other than the metal oxide with a melting point of 800° C. or less in addition to the metal oxide with a melting point of 800° C. or less.

Here, the nanoparticle-fixed body means a body composed in such a manner that plural nanoparticles containing at least one type of nanoparticles of the metal oxide with a melting point of 800° C. or less are fixed to one another, the composed body having the nanoparticles fixed to one another by intermolecular force. In the nanoparticle-fixed body, usually, grain boundaries are present between the adjacent nanoparticles. However, when two or more types of the metal oxides with a melting point of 800° C. or less are used, then in some cases, a eutectic material is generated between the nanoparticles to cause disappearance of the grain boundaries.

A description will be given of the metal oxide with a melting point of 800° C. or less. As the metal oxide with a melting point of 800° C. or less, for example, at least one type of metal oxide selected from the group consisting of molybdenum oxide, vanadium oxide, lead oxide, tellurium oxide, boron oxide and chromium oxide is used.

As the molybdenum oxide, for example, $MoO_3$ (melting point: 795° C.) is used. As the vanadium oxide, for example, $V_2O_5$ (melting point: 690° C.) is used. As the lead oxide, for example, $PbO_2$ (melting point: 290° C.), $Pb_3O_4$ (melting point: 500° C.) or the like is used. As the tellurium oxide, for example, $TeO_2$ (melting point: 733° C.) is used. As the boron oxide, for example, $B_2O_3$ (melting point: 430° C.) is used. As the chromium oxide, for example, $CrO_3$ (melting point: 196° C.) is used.

Figure 2:
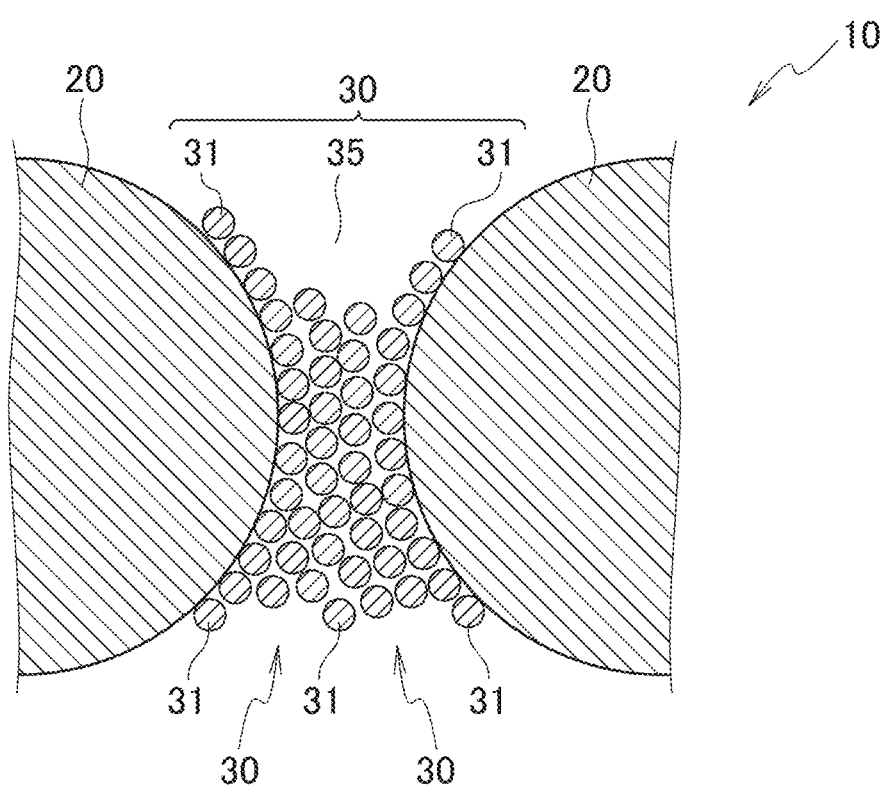
FIG. 2 is a schematic cross-sectional view enlargedly showing a portion A in FIG. 1.
Figure 3:
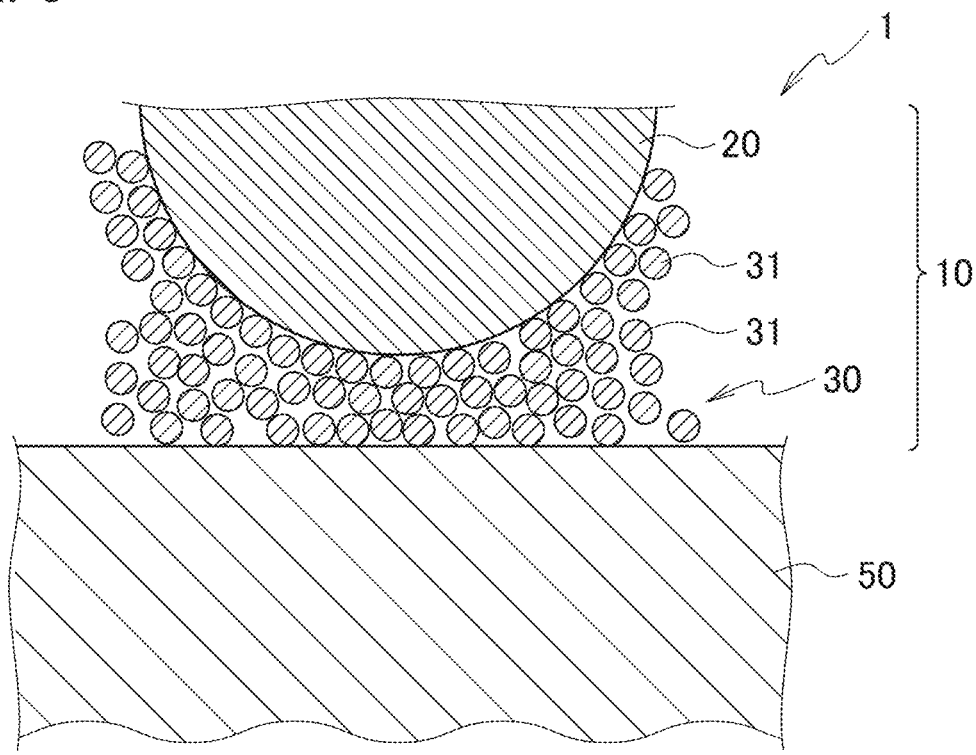
FIG. 3 is a schematic cross-sectional view enlargedly showing a portion B in FIG. 1.

In the wavelength conversion member 1 according to the first embodiment, the binder layer 30 is the nanoparticle-fixed body made of only the nanoparticles of the metal oxide with a melting point of 800° C. or less. This binder layer 30 will be described with reference to FIGS. 2 and 3. FIG. 2 is a schematic cross-sectional view enlargedly showing a portion A in FIG. 1. FIG. 3 is a schematic cross-sectional view enlargedly showing a portion B in FIG. 1. As shown in FIGS. 2 and 3, the binder layer 30 is made of a nanoparticle-fixed body containing at least one type of the nanoparticles 31 of the metal oxide with a melting point of 800° C. or less.

Note that the nanoparticle-fixed body that is the binder layer 30 just needs to contain at least one type of the nanoparticles 31 of the metal oxide with a melting point of 800° C. or less, and may contain nanoparticles other than the nanoparticles 31 of the metal oxide with a melting point of 800° C. or less. The wavelength conversion member 1A according to the second embodiment to be described later is an embodiment of containing nanoparticles 32 other than the nanoparticles 31 of the metal oxide with a melting point of 800° C. or less.

In this embodiment, the binder layer 30 is made of the nanoparticle-fixed body containing at least one type of the nanoparticles 31 of the metal oxide with a melting point of 800° C. or less. Accordingly, the nanoparticles 31 in the inside of the binder layer 30 are strongly fixed to one another, the binder layer 30 and the inorganic phosphor particles 20 are strongly fixed to each other, and the binder layer 30 and the substrate 50 are strongly fixed to each other. The reason why the binder layer 30 made of the nanoparticle-fixed body containing at least one type of the nanoparticles 31 of the metal oxide with a melting point of 800° C. or less has such strong fixing strength as described above is presumed to be as follows.

The binder layer 30 made of the nanoparticle-fixed body maintains a shape of itself in such a manner that the nanoparticles 31 of the metal oxide with a melting point of 800° C. or less are fixed by one another by intermolecular force. The nanoparticles 31 of the metal oxide with a melting point of 800° C. or less are easier to deform than nanoparticles 31 of a metal oxide with a melting point exceeding 800° C. Therefore, in comparison with a nanoparticle-fixed body using the nanoparticles of the metal oxide with a melting point exceeding 800° C., in the binder layer 30, usually, a mutual distance between the nanoparticles 31, a mutual distance between the adjacent inorganic phosphor particles 20 and a distance between the inorganic phosphor particles 20 and the substrate 50 are shortened. The following is presumed as a result. That is, in the wavelength conversion member 1, strong intermolecular force acts between the nanoparticles 31 and the nanoparticles 31, between the nanoparticles 31 and the inorganic phosphor particles 20, and between the nanoparticles 31 and the substrate 50, resulting in enhancement of mechanical strength of the wavelength converter 10 and adhesion of the wavelength converter 10 and the substrate 50.

Note that, when being subjected to heat treatment at a relatively low temperature approximately ranging from 400 to 800° C. for example, the nanoparticles 31 of the metal oxide with a melting point of 800° C. or less is softened and becomes easier to deform than the case without the heat treatment. Therefore, when being subjected to the heat treatment at the relatively low temperature approximately ranging from 400 to 800° C. in the course of being manufactured, the binder layer 30 can further shorten the mutual distance between the nanoparticles 31, the mutual distance between the adjacent inorganic phosphor particles 20, and the distance between the inorganic phosphor particles 20 and the substrate 50. In this way, when the wavelength conversion member 1 is subjected to the above-described heat treatment at a relatively low temperature, stronger intermolecular force will act between the mutual nanoparticles 31, between the nanoparticles 31 and the inorganic phosphor particles 20, and between the nanoparticles 31 and the substrate 50. As a result, it is presumed that, when the wavelength conversion member 1 is subjected to the above-described heat treatment at a relatively low temperature, the mechanical strength of the wavelength conversion member 10 and the adhesion between the wavelength converter 10 and the substrate 50 are further enhanced.

For example, as shown in FIG. 2, the adjacent inorganic phosphor particles 20 are strongly fixed to one another by the binder layer 30. Moreover, as shown in FIG. 3, the inorganic phosphor particles 20 and the substrate 50 are strongly fixed to each other by the binder layer 30.

Note that, in FIGS. 2 and 3, reference numerals 31 denotes the nanoparticles of the metal oxide with a melting point of 800° C. or less. Therefore, in FIGS. 2 and 3, even an oxide having a different chemical composition is denoted by the same reference numerals 31 as long as the oxide takes a form of the nanoparticles of the metal oxide with a melting point of 800° C. or less. For example, in FIGS. 2 and 3, when the nanoparticles 31 are a mixture of nanoparticles of a metal oxide A with a melting point of 800° C. or less and a metal oxide B with a melting point of 800° C. or less, the nanoparticles of the metal oxide A and the metal oxide B are collectively shown as the nanoparticles 31.

Regarding a size of the nanoparticles 31 of the metal oxide with a melting point of 800° C. or less, an average particle size $D_{50}$ is usually not less than 1 nm and less than 100 nm (not less than 10 angstrom and less than 1000 angstrom), preferably not less than 1 nm and less than 95 nm. Regarding the size of the nanoparticles 31 of the metal oxide with a melting point of 800° C. or less, the average particle size $D_{50}$ is more preferably not less than 10 nm and less than 50 nm, still more preferably not less than 15 nm and less than 25 nm. When the average particle size $D_{50}$ of the nanoparticles remains within the above-described ranges, the nanoparticles are fixed to one another by the intermolecular force, and the binder layer 30 made of the strong nanoparticle-fixed body is formed. Therefore, when the average particle size $D_{50}$ of the nanoparticles remains within the above-described ranges, then the nanoparticles 31 in the inside of the binder layer 30 are strongly fixed to one another with ease, the binder layer 30 and the inorganic phosphor particles 20 are strongly fixed to each other with ease, and the binder layer 30 and the substrate 50 are strongly fixed to each other with ease. The average particle size $D_{50}$ of the nanoparticles 31 is calculated, for example, by measurement for the binder layer 30 using a transmission electron microscope (TEM), a scanning electron microscope (SEM), a field emission-scanning electron microscope (FE-SEM) or the like.

It is preferable that the binder layer 30 not contain an organic substance as much as possible. If the organic substance is contained in the binder layer 30, when the binder layer 30 is irradiated with high-power excitation light of a laser light source or the like, it is apprehended that the organic substance contained in the binder layer 30 may be discolored and burnt to decrease light transmittance.

In FIG. 1, the binder layer 30 covers entire surfaces of the inorganic phosphor particles 20. However, in this embodiment, the binder layer 30 does not need to cover the entire surfaces of the phosphor particles 20, and among the surfaces of the inorganic phosphor particles 20, just need to cover surfaces of the inorganic phosphor particles 20 only in portions interposed between the adjacent phosphor particles 20. That is, the binder layer 30 just needs to cover at least some parts of the surfaces of the inorganic phosphor particles 20.

Note that, when the entire surfaces of the inorganic phosphor particles 20 are covered with the binder layer 30, then the binder layer 30 prevents or reduces a refractive index step between the inside and outside of each of the inorganic phosphor particles 20. Therefore, the conversion efficiency of the inorganic phosphor particles 20 is easy to increase. Meanwhile, when only a part of the surfaces of the inorganic phosphor particles 20 is covered with the binder layer 30, then the binder layer 30 thus partially formed serves as a light scattering source. Therefore, light extraction efficiency of light from the wavelength converter 10 to the outside is easy to enhance.

As shown in FIGS. 1 and 2, air gaps 35 formed between portions of the binder layer 30 and air gaps 35 formed in such a manner that the binder layer 30 is partially dented may be formed in the wavelength converter 10. The latter air gaps 35 are considered to be formed since spaces between the adjacent inorganic phosphor particles 20 are not filled with the nanoparticles 31 when the binder layer 30 is formed. When the binder layer 30 includes the air gaps 35 formed by the partial denting of the binder layer 30 itself, then light is scattered, and such light extraction efficiency from the wavelength converter 10 to the outside is easy to enhance.

A thickness of the wavelength converter 10 is not particularly limited; however, for example, is set to 40 to 400 μm, preferably 80 to 200 μm. It is preferable that the thickness of the wavelength converter 10 remain within such a range as described above since the heat dissipation can be maintained to be relatively high at that time.

<Manufacturing Method of Wavelength Conversion Member>

For example, the wavelength conversion member 1 can be manufactured by the following method. First, the inorganic phosphor particles 20 and a nanoparticle dispersion liquid are mixed with each other. In the nanoparticle dispersion liquid, nanoparticles include the nanoparticles 31 of the metal oxide with a melting point of 800° C. or less. In this way, a mixed solution is prepared.

Note that a dispersant is added to the nanoparticle dispersion liquid or the mixed solution according to needs. Usually, the dispersant is composed of an organic component. The mixed solution is adjusted in viscosity, for example, so as to turn to a paste form. The viscosity of the mixed solution is adjusted, for example, by adjusting concentrations of solid contents of the inorganic phosphor particles 20, the nanoparticles including the nanoparticles 31 of the metal oxide with a melting point of 800° C. or less, and the like.

Next, this mixed solution in the paste form is applied onto the substrate 50 such as a metal substrate. For the application of the mixed solution in the paste form, for example, used are a variety of known application methods such as application using an applicator equipped with a bar coater and screen printing under a normal pressure environment.

[Drying Step]

Moreover, carried out is a drying step of drying and solidifying the mixed solution in the paste form on the substrate 50. The drying step is a step of obtaining the wavelength converter 10 by solidifying the mixed solution in the paste form. The obtained wavelength converter 10 has: the inorganic phosphor particles 20; and the binder layer 30 that fixes the inorganic phosphor particles 20 to one another. Moreover, when the wavelength converter 10 is formed on the substrate 50, the wavelength conversion member 1 including the substrate 50 and the wavelength converter 10 is formed.

A heating temperature in the drying step is, for example, 50 to 150° C., preferably 80 to 120° C. Moreover, a heating time in the drying step is, for example, 30 to 120 minutes, preferably 40 to 80 minutes. When the heating temperature and the heating time in the drying step remain within the above-described ranges, the wavelength converter 10 can be formed efficiently.

[Firing Step]

The organic substance may sometimes remain in the binder layer 30 of the wavelength converter 10. Moreover, in the binder layer 30, fixing strength between the nanoparticles 31 of the metal oxide with a melting point of 800° C. or less may sometimes not be sufficiently high. Therefore, after the drying step, it is preferable to perform a firing step for the wavelength conversion member 1 in order to prevent the organic substance from remaining in the binder layer 30, and to strongly adhere the nanoparticles 31 to one another, the nanoparticles 31 constituting the binder layer 30.

When the firing step is further performed for the wavelength conversion member 1, the nanoparticles 31 of the metal oxide with a melting point of 800° C. or less are fixed to one another stronger than those in the wavelength conversion member 1 before being subjected to the firing step, the nanoparticles 31 and the inorganic phosphor particles 20 are fixed to each other stronger than those described above, and the nanoparticles 31 and the substrate 50 are fixed to each other stronger than those described above.

A heating temperature in the firing step is, for example, not less than 400° C., preferably 400 to 800° C., more preferably 400 to 500° C., still more preferably 430 to 470° C. Moreover, a heating time in the firing step is, for example, 60 to 180 minutes, preferably 100 to 150 minutes. When the heating temperature and the heating time in the firing step remain within the above-described ranges, even if the organic substance is contained in the binder layer 30 before being subjected to the firing step, the organic substance in the binder layer 30 can be burnt down, and the fixing strength in the nanoparticle-fixed body of the binder layer 30 is increased.

Note that the reason why the organic substance may sometimes remain in the binder layer 30 and the reason why the organic substance should be removed are as follows.

The above-described dispersant added to the nanoparticle dispersion liquid or the mixed solution according to needs usually contains the organic substance. This organic substance sometimes remains in the binder layer 30 without being burnt down even if the above described drying step is performed. When the wavelength converter 10 in which the organic substance remains in the binder layer 30 as described above is irradiated with excitation light with high power in order to covert the color of the incident light, then the organic substance in the binder layer 30 may possibly be degraded by heat to lower optical properties of the wavelength converter 10. Moreover, since the organic substance generally has lower thermal conductivity than an inorganic substance, thermal conductivity of the wavelength converter 10 may possibly be lowered by the organic substance remaining in the binder layer 30. Therefore, in this manufacturing method, preferably, the firing step is performed so that the organic substance can be burnt down by thermal decomposition even if the organic substance remains in the binder layer 30.

The firing step is suitable when the nanoparticles 31 of the metal oxide with a melting point of 800° C. or less are nanoparticles composed of at least one type of metal oxide selected from the group consisting of molybdenum oxide, vanadium oxide, lead oxide, tellurium oxide, boron oxide and chromium oxide.

The reason why the firing step enhances the fixing strength of the mutual nanoparticles 31 of the metal oxide with a melting point of 800° C. or less is as follows.

In the wavelength conversion member 1, in the heating treatment in the drying step, a solvent between the mutual nanoparticles 31, between the nanoparticles 31 and the inorganic phosphor particles 20 and between the nanoparticles 31 and the substrate 50 is removed. Then, distances between the mutual nanoparticles 31, between the nanoparticles 31 and the inorganic phosphor particles 20 and between the nanoparticles 31 and the substrate 50 are shortened to increase the intermolecular force, and therefore, the nanoparticle-fixed body fixed to the inorganic phosphor particles 20 and the substrate 50 is obtained. The reason is presumed as above. However, since the shape of the nanoparticles 31 themselves does not change very much by the heating treatment in the above-described drying step, the distances between the mutual nanoparticles 31, between the nanoparticles 31 and the inorganic phosphor particles 20 and between the nanoparticles 31 and the substrate 50 remain relatively large. Therefore, it is presumed that, in the wavelength conversion member 1 obtained after the drying step, the intermolecular force between the mutual nanoparticles 31, between the nanoparticles 31 and the inorganic phosphor particles 20 and between the nanoparticles 31 and the substrate 50 remains relatively small, and there is room for enhancing the fixing strength therebetween.

In contrast, when the binder layer 30 is subjected to the firing step performed at a higher temperature than at the drying step, the nanoparticles 31 constituting the binder layer 30 are softened and deformed to further shorten the distances between the mutual nanoparticles 31, between the nanoparticles 31 and the inorganic phosphor particles 20 and between the nanoparticles 31 and the substrate 50. Therefore, it is presumed that, in a state of the binder layer 30 obtained after the firing step, the intermolecular force is increased between the mutual nanoparticles 31, between the nanoparticle 31 and the inorganic phosphor particles 20 and between the nanoparticles 31 and the substrate 50, and the fixing strength therebetween is further strengthened.

Note that, in the wavelength conversion member 1 as a target to be subjected to the firing step, the wavelength converter 10 is ceramics since the wavelength converter 10 is composed of the inorganic phosphor particles 20 and the binder layer 30 containing the metal oxide as a main component. Meanwhile, the metal substrate 50 is sometimes used as such a substrate 50. When the ceramics and the metal are compared with each other, the ceramics usually has smaller thermal expansion coefficient and thermal conductivity than the metal. Therefore, it is presumed that, when the substrate 50 is the metal substrate 50, the thermal expansion coefficient greatly differs between the metal substrate 50 and the wavelength converter 10 at the time of the firing step, and there acts force to peel off the metal substrate 50 and the wavelength converter 10 from each other.

However, in the wavelength conversion member 1 according to this this embodiment, after the firing step, there is obtained the wavelength conversion member 1 in which the nanoparticles 31 of the metal oxide with a melting point of 800° C. or less are strongly fixed to one another, the nanoparticles 31 and the inorganic phosphor particles 20 are strongly fixed to each other, and the nanoparticles 31 and the substrate 50 are fixed to each other. Therefore, in this embodiment, even if the thermal expansion coefficient greatly differs between the substrate 50 and the wavelength converter 10 due to the firing step, the metal substrate 50 and the wavelength converter 10 are strongly fixed to each other by the strong fixing strength of the binder layer 30, and are prevented from being peeled off from each other. Therefore, in the wavelength conversion member 1 according to this embodiment, the metal substrate 50 and the wavelength converter 10 are not peeled off from each other in a substantial manner.

(Functions)

Functions of the wavelength conversion member 1 will be described. The wavelength conversion member 1 of this embodiment is irradiated with the excitation light, whereby the inorganic phosphor particles 20 in the wavelength converter 10 are excited to radiate secondary light. Note that the binder layer 30 composed of the nanoparticle-fixed body in which the plurality of nanoparticles 31 are fixed to one another is formed on the surfaces of the inorganic phosphor particles 20. However, since the nanoparticles 31 are made of the material having high transmissivity for the excitation light, the excitation light is transmitted through the binder layer 30 and applied to the inorganic phosphor particles 20, and the inorganic phosphor particles 20 are excited and capable of radiating the secondary light.

When the substrate 50 is a substrate 50 having low optical transparency, the secondary light generated in the wavelength converter 10 is radiated from a front surface side of the wavelength converter 10. Moreover, when the substrate 50 is a substrate 50 having high optical transparency, the secondary light generated in the wavelength converter 10 is radiated from the front surface side of the wavelength converter 10 and a front surface side of the substrate 50.

(Advantageous Effects of Invention)

In the wavelength conversion member 1, the binder layer 30 of the wavelength converter 10 is the nanoparticle-fixed body containing at least one type of the nanoparticles 31 of the metal oxide with a melting point of 800° C. or less, the metal oxide being an inorganic material having high heat resistance and heat dissipation. Therefore, even in the case of using, as excitation light, the high-power excitation light of the laser light source or the like, the wavelength conversion member 1 has high heat resistance and heat dissipation. Moreover, since the binder layer 30 has high heat dissipation, the wavelength conversion member 1 is less likely to cause the temperature quenching that may be caused by a temperature rise of the inorganic phosphor particles 20 even in the case of using the high-power excitation light of the laser light source or the like.

Furthermore, an amount of the organic substance contained in the binder layer 30 of the wavelength converter 10 is an amount of impurities at most, and the organic substance is not substantially contained in the binder layer 30. Therefore, even if the wavelength conversion member 1 uses the high-power excitation light of the laser light source or the like, the discoloration of the binder layer 30 and burning of the binder layer 30 due to thermal degradation of the organic substance do not substantially occur, and accordingly, the wavelength conversion member 1 has high heat resistance.

Moreover, in the wavelength conversion member 1, since the binder layer 30 can be formed without being sintered at a temperature as high as not less than 800° C., the inorganic phosphor particles 20 having low heat resistance can be used. For example, the (Sr,Ca)AlSiN$_3$:Eu phosphor has excellent color rendering, but causes an oxidation reaction under a high-temperature environment. Therefore, in the conventional wavelength converter required to be sintered at high temperature in order to form the binder layer, the oxidation reaction occurs in the (Sr,Ca)AlSiN$_3$:Eu phosphor, and the color rendering is prone to decrease. In contrast, in the wavelength converter 1, since the binder layer 30 can be formed without performing the sintering at high temperature, such a phosphor described above can also be used as the inorganic phosphor particles 20, and the color rendering of the wavelength converter 10 can be enhanced.

Moreover, in the case of performing the firing step in order to burn down the organic substance in the binder layer 30, the wavelength converter 10 just needs to be subjected to a firing step at a temperature as low as approximately not less than 400° C. This is because the binder layer 30 is composed of the nanoparticle-fixed body containing at least one type of the nanoparticles 31 of the metal oxide with a melting point of 800° C. or less. As described above, the wavelength conversion member 1 can be produced without performing the sintering step at high temperature, and accordingly, has high productivity.

Second Embodiment

Figure 4:
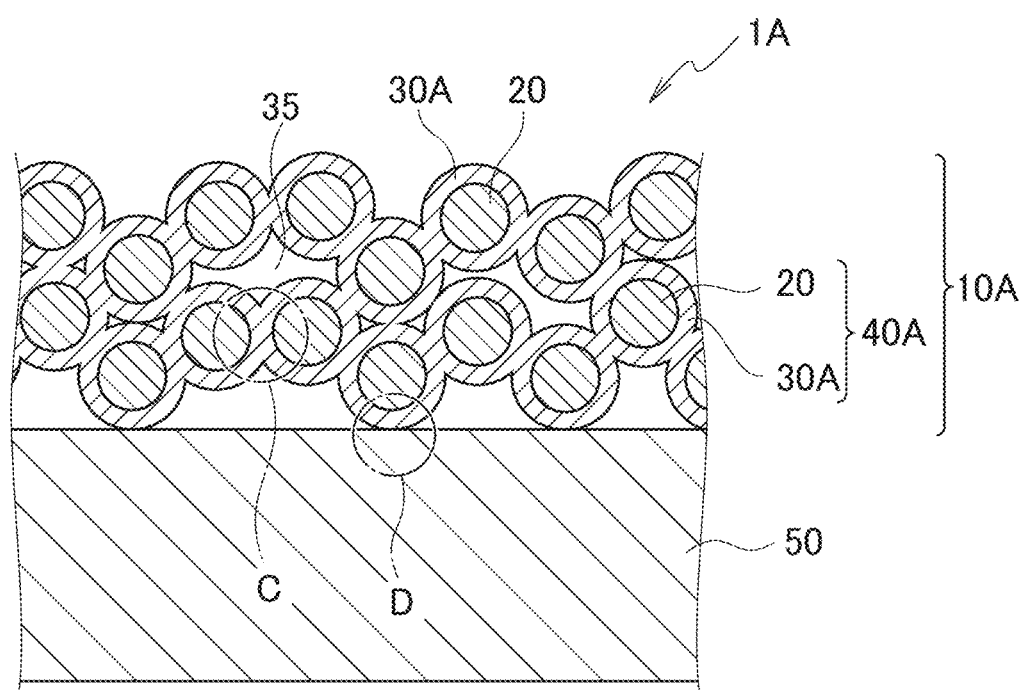
FIG. 4 is a schematic cross-sectional view of a wavelength conversion member according to a second embodiment.

FIG. 4 is a schematic cross-sectional view of a wavelength conversion member according to a second embodiment. A wavelength conversion member 1A according to the second embodiment is an embodiment in which the binder layer 30 is a nanoparticle-fixed body. A wavelength conversion member 1A shown as the second embodiment in FIG. 4 is a member in which a wavelength converter 10A is substituted for the wavelength converter 10 of the wavelength conversion member 1 shown as the first embodiment in FIG. 1. The wavelength conversion member 1A has the same configuration as that of the wavelength conversion member 1 except for the above. Moreover, the wavelength converter 10A of the second embodiment is a converter in which a binder layer 30A and a nanoparticle-covered phosphor particles 40A are substituted respectively for the binder layer 30 and nanoparticle-covered phosphor particles 40 of the wavelength converter 10 of the first embodiment. The wavelength converter 10A has the same configuration as that of the wavelength converter 10 except for the above. Therefore, between the wavelength conversion member 1A shown as the second embodiment in FIG. 4 and the wavelength conversion member 1 shown as the first embodiment in FIG. 1, the same reference numerals are assigned to the same members, and a description of configurations and functions thereof will be omitted or simplified.

<Wavelength Converter>

The wavelength converter 10A is a converter in which the binder layer 30A is substituted for the binder layer 30 of the wavelength conversion member 1 according to the first embodiment. In comparison with the binder layer 30, the binder layer 30A includes nanoparticles 32 other than the nanoparticles 31 of the metal oxide with a melting point of 800° C. or less in addition to the nanoparticles 31.

Figure 5:
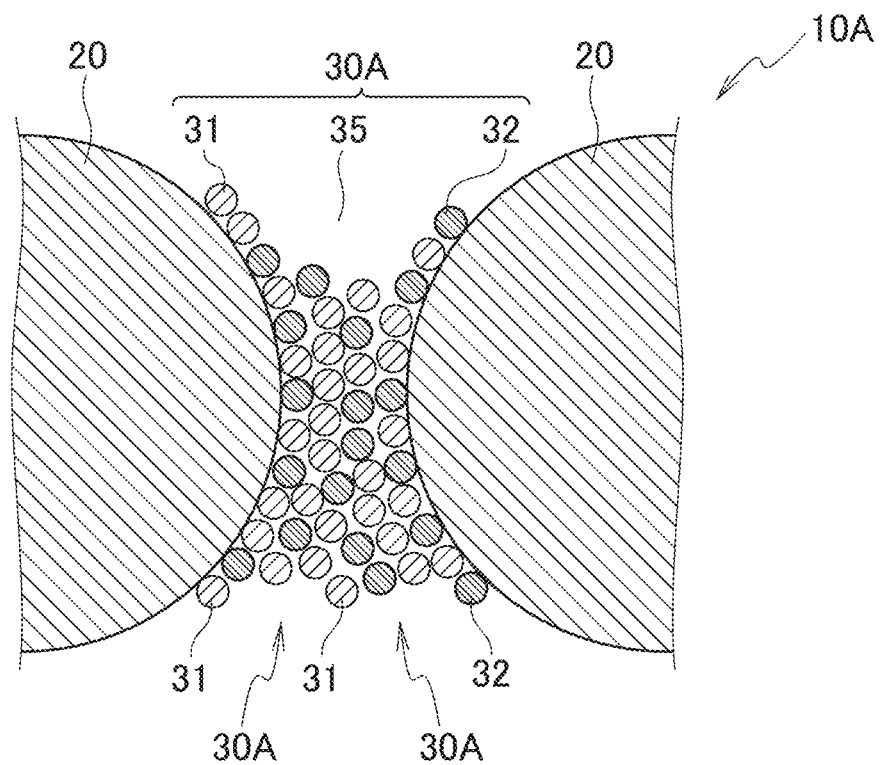
FIG. 5 is a schematic cross-sectional view enlargedly showing a portion C in FIG. 4.
Figure 6:
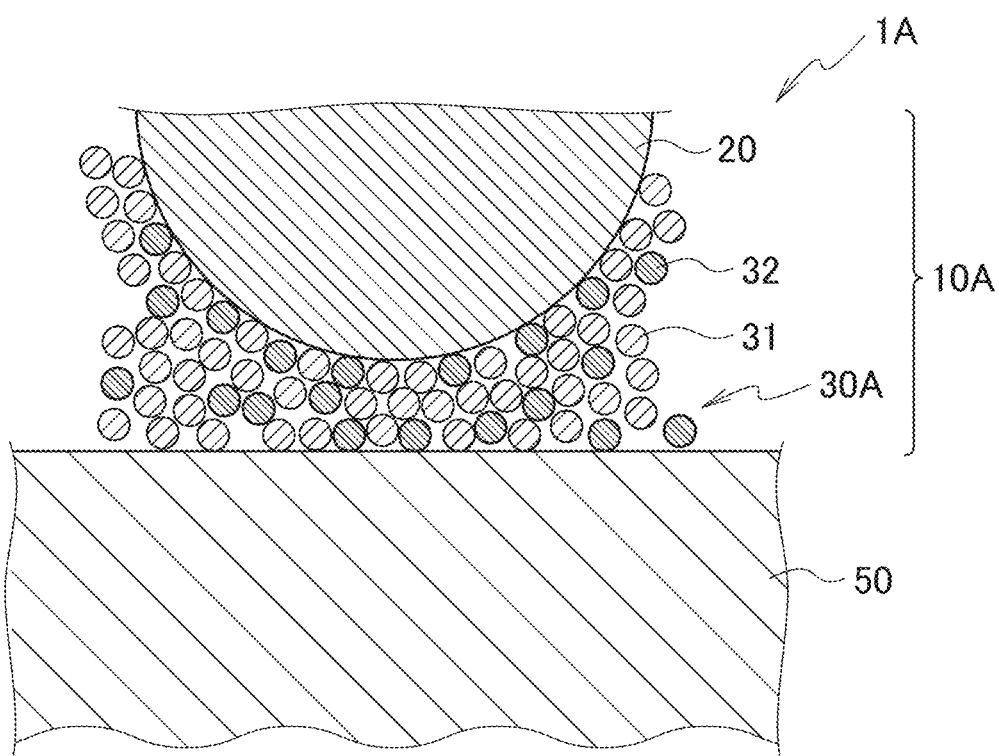
FIG. 6 is a schematic cross-sectional view enlargedly showing a portion D in FIG. 4.

This binder layer 30A will be described with reference to FIGS. 5 and 6. FIG. 5 is a schematic cross-sectional view enlargedly showing a portion C in FIG. 4. FIG. 6 is a schematic cross-sectional view enlargedly showing a portion D in FIG. 4. As shown in FIGS. 5 and 6, in the wavelength conversion member 1A according to the second embodiment, the binder layer 30A is a nanoparticle-fixed body containing at least one type of the nanoparticles 31 of the metal oxide with a melting point of 800° C. or less and containing the nanoparticles 32 other than the nanoparticles 31. The nanoparticles 32 other than the nanoparticles 31 are, for example, such nanoparticles 32 composed of the metal oxide with a melting point exceeding 800° C.

The metal oxide constituting the nanoparticles 32, the metal oxide being other than the metal oxide with a melting point of 800° C. or less, are usually a metal oxide with a melting point exceeding 800° C. As the metal oxide with a melting point exceeding 800° C., for example, there are used nanoparticles of aluminum oxide (alumina, melting point: 2072° C.), silicon dioxide, titanium oxide, zinc oxide (decomposition temperature: 1975° C.), cesium dioxide, nickel dioxide, tin oxide, indium oxide, zirconium oxide, boron nitride, aluminum nitride, and the like. As aluminum oxide, for example, $Al_2O_3$ is used. As zinc oxide, for example, ZnO is used. These metal oxides with a melting point exceeding 800° C. are easy to generate eutectic materials with the above-described metal oxide with a melting point of 800° C. or less. Moreover, boron nitride is preferable since the boron nitride enhances the heat dissipation of the binder layer.

If the material of the nanoparticles 31 is molybdenum oxide (melting point: 795° C.) when the material of the nanoparticles 32 is zinc oxide ZnO, then on interfaces between the nanoparticles 32 and the nanoparticle 31, $ZnMoO_4$ that is a eutectic material is generated at around 710° C. lower than the melting points of both of the materials. As describe above, between the nanoparticles 32 and the nanoparticles 31, the eutectic material is generated between the nanoparticles at a temperature lower than the melting points of the individual materials, and the nanoparticles 32 and the nanoparticles 31 are strongly fixed to each other. The eutectic material is different from the materials constituting the nanoparticles 31 and the nanoparticles 32, and accordingly, portions composed of the eutectic material form grain boundaries between the nanoparticles 31 and the nanoparticles 32.

As described above, if the binder layer 30A further includes the nanoparticles 32 of zinc oxide, then the nanoparticles 32 and the nanoparticles 31 are easy to be strongly fixed to each other. Specifically, when fixed portions between the adjacent nanoparticles 31 and 32 in the nanoparticle-fixed body of the binder layer 30A include the eutectic material composed of the metal oxide with a melting point of 800° C. or less and the metal oxide with a melting point exceeding 800° C., the nanoparticle 31 and the nanoparticles 32 are easy to be strongly fixed to each other. For example, $ZnMoO_4$ is cited as the eutectic material that forms the fixed portions between the nanoparticles 31 and 32.

A content ratio of the nanoparticles 31 of the metal oxide with a melting point of 800° C. or less in the binder layer 30A is usually 50 to 99% by mass, preferably 80 to 95% by mass, preferably 90 to 95% by mass. When the content ratio of the nanoparticles 31 of the metal oxide with a melting point of 800° C. or less remains within the above-described range, then the nanoparticles 31 and 32 in the inside of the binder layer 30A are strongly fixed to one another, the binder layer 30A and the inorganic phosphor particles 20 are strongly fixed to each other, and the binder layer 30A and the substrate 50 are strongly fixed to each other. In this way, mechanical strength of the wavelength converter 10A is easy to enhance, and adhesion of the wavelength converter 10A and the substrate 50 are easy to enhance.

(Functions)

Functions of the wavelength conversion member 1A are the same as the functions of the wavelength conversion member 1 except that the generation of the eutectic material makes it easy to more strongly fix the nanoparticles 31 and 32 in the inside of the binder layer 30A to one another, the binder layer 30A and the inorganic phosphor particles 20 to each other, and the binder layer 30A and the substrate 50 to each other. Therefore, the description of the functions of the wavelength conversion member 1A will be omitted.

(Advantageous Effects of Invention)

Advantageous effects of the invention inherent in the wavelength conversion member 1A are the same as the advantageous effects of the invention inherent in the wavelength conversion member 1 except that the generation of the eutectic material more strongly fixes the nanoparticles 31 and 32 in the inside of the binder layer 30A to one another, the binder layer 30A and the inorganic phosphor particles 20 to each other, and the binder layer 30A and the substrate 50 to each other. Therefore, the description of the advantageous effects of the invention inherent in the wavelength conversion member 1A will be omitted.

Third Embodiment

A wavelength conversion member according to a third embodiment is a member in which the binder layer 30A composed of the nanoparticle-fixed body of the wavelength conversion member 1A according to the second embodiment is composed of a body other than the nanoparticle-fixed body. Specifically, a binder layer of a wavelength conversion member according to the third embodiment is composed of a bulk body containing at least one type of the metal oxide with a melting point of 800° C. or less. Here, the bulk body means a bulk substance containing at least one type of the metal oxide with a melting point of 800° C. or less, the bulk substance having a form other than that of the nanoparticle-fixed body.

As the bulk body, for example, there are used a polycrystal made of crystal grains larger than the nanoparticles, an amorphous body, and the like. Here, the crystal grains larger than the nanoparticles mean crystal grains with an average particle size $D_{50}$ of 100 nm or more. The above-described polycrystal is considered to be generated in such a manner that the adjacent nanoparticles are fused and so on by heating treatment or the like to increase a crystal structure. Moreover, the amorphous body means a solid in which the metal oxide with a melting point of 800° C. or less is in an amorphous state.

A composition of the binder layer composed of the bulk body is the same as that of the material of the nanoparticles of the metal oxide with a melting point of 800° C. or less, the nanoparticles constituting the binder layer 30 composed of the nanoparticle-fixed body of the wavelength conversion member 1 according to the first embodiment. Specifically, the metal oxide with a melting point of 800° C. or less is at least one type of metal oxide selected from the group consisting of molybdenum oxide, vanadium oxide, lead oxide, tellurium oxide, boron oxide and chromium oxide.

Moreover, the composition of the binder layer composed of the bulk body may also include a metal oxide with a melting point exceeding 800° C. in addition to the metal oxide with a melting point of 800° C. or less. Alternatively, the composition may include a eutectic material made of the metal oxide with a melting point of 800° C. or less and the metal oxide with a melting point exceeding 800° C. The metal oxide with a melting point exceeding 800° C. and the eutectic material are the same as those mentioned in the wavelength conversion member 1A according to the second embodiment, and accordingly, a description thereof will be omitted. Note that, if the binder layer composed of the bulk body further includes boron nitride in addition to the metal oxide with a melting point of 800° C. or less, then this is preferable since the heat dissipation of the binder layer is enhanced. In the binder layer, boron nitride may be present alone, or may form the eutectic material together with the metal oxide with a melting point of 800° C. or less. Moreover, preferably, the eutectic material of the binder layer composed of the bulk body is $ZnMoO_4$. The reason for this is because, since the eutectic material is generated at a temperature as low as approximately 710° C., the bulk body can be formed at low temperature, and the thermal conductivity of the binder layer is increased.

Figure 7:
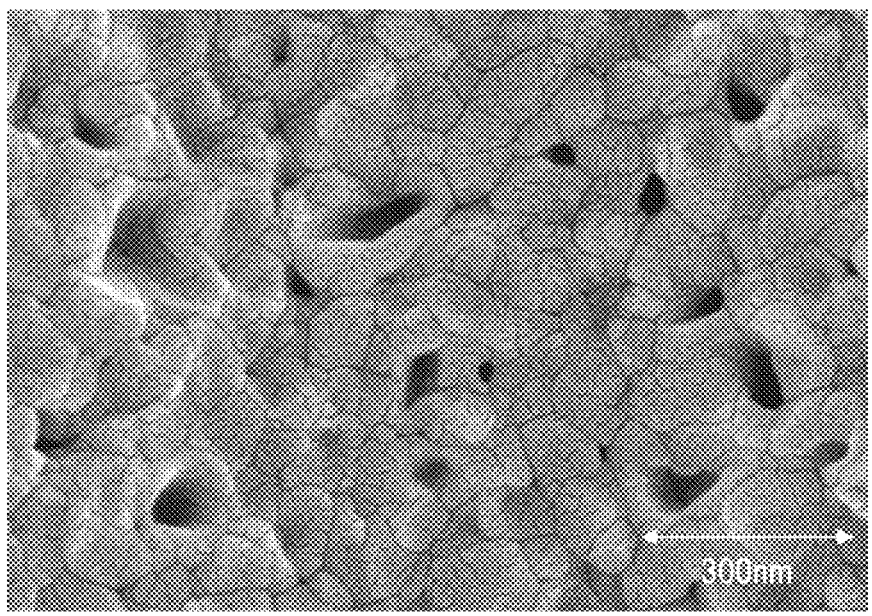
FIG. 7 is an example of a scanning electron microscope (SEM) picture of a surface of a binder layer, the surface having appeared on a fracture surface of a wavelength converter of a wavelength conversion member according to each of a third embodiment and Example 2.

FIG. 7 is an example of a scanning electron microscope (SEM) picture of a surface of the binder layer, the surface having appeared on a fracture surface of the wavelength converter of the wavelength conversion member according to each of the third embodiment and Example 2 to be described later. The whole shown in FIG. 7 is the binder layer. The binder layer shown in FIG. 7 is the bulk body composed of the polycrystal, in which air gaps with a diameter of several ten nanometers are formed on the surface of the binder layer.

The binder layer composed of the bulk body in the wavelength conversion member according to Example 2 to be described later, the binder layer being shown in FIG. 7, is an example where there is formed $ZnMoO_4$ that is the eutectic material of the metal oxide with a melting point of 800° C. or less and the metal oxide with a melting point exceeding 800° C. The binder layer shown in FIG. 7 is a layer obtained by performing the heating treatment for the binder layer composed of the nanoparticle-fixed body. Here, necking occurs between the adjacent nanoparticles by the heating treatment, whereby the binder layer is the polycrystal composed of the crystal grains larger than the nanoparticles.

<Manufacturing Method of Wavelength Conversion Member>

A manufacturing method of the wavelength conversion member according to the third embodiment is similar to that of the wavelength conversion member according to the first embodiment except for the generation of the binder layer composed of the bulk body. Therefore, a description will be given below of a generation method of the binder layer composed of the bulk body in the wavelength conversion member according to the third embodiment.

[Generation Method of Binder Layer]

The generation method of the binder layer is a method related to the binder layer composed of the nanoparticle-fixed body and generated in the wavelength conversion member according to the first embodiment. In this generation method, the binder layer is further heated to be changed to the bulk body. The method of further heating the binder layer composed of the nanoparticle-fixed body includes, for example, a method of using an AlN substrate excellent in thermal conduction as the substrate, and a method of performing heating treatment at a higher temperature for a longer time than those in the heating treatment for generating the nanoparticle-fixed body.

(Functions)

Functions of the wavelength conversion member according to the third embodiment are the same as the functions of the wavelength conversion member 1A according to the second embodiment except for a functional difference based on the difference in structure of the binder layer. Therefore, the functional difference based on the difference in structure of the binder layer will be described below, and a description of the other functions will be omitted. The binder layer of the wavelength conversion member according to the third embodiment is composed of the bulk body. Accordingly, in comparison with the binder layer 30A composed of the nanoparticle-fixed body of the wavelength conversion member 1A according to the second embodiment, the binder layer of the wavelength conversion member according to the third embodiment has no or little grain boundaries inhibiting the thermal conduction. Therefore, in comparison with the binder layer 30A of the wavelength conversion member 1A according to the second embodiment, the binder layer of the wavelength conversion member according to the third embodiment has enhanced thermal conductivity in the inside thereof.

(Advantageous Effects of Invention)

Advantageous effects of the wavelength conversion member according to the third embodiment are the same as the advantageous effects of the invention in the wavelength conversion member 1A according to the second embodiment except that the thermal conductivity in the binder layer is enhanced since the binder layer is composed of the bulk body. Therefore, the description of the advantageous effects of the invention inherent in the wavelength conversion member according to the third embodiment will be omitted.

Note that, in the first and second embodiments, within a range of not inhibiting the heat dissipation of the wavelength converter 10, surface treatment may be performed for at least one type of the nanoparticles 31, the nanoparticles 32 other than the nanoparticles 31, the nanoparticles other than the nanoparticles 31 and 32, and the inorganic phosphor particles 20. For example, this surface treatment is performed in order to enhance compactness of the binder layers 30 and 30A and adhesion of the binder layers 30 and 30A to the inorganic phosphor particles 20 or the substrate 50.

Moreover, in the first to third embodiments described above, at least one type of a metal thin film layer and an oxide thin film layer may be formed on the surface of the substrate, the surface facing to the binder layer. For example, on the surface of the substrate, the surface facing to the binder layer, the metal thin film layer and the oxide thin film layer may be laminated in this order, and then the binder layer may be formed on a surface of the oxide thin film layer. When at least one type of the metal thin film layer and the oxide thin film layer is formed on the surface of the substrate, the substrate facing to the binder layer, then this is preferable since reflectance can be enhanced by using a material having a higher reflectance than the substrate. Note that, in the wavelength conversion member with this configuration, the binder layer is indirectly fixed to the substrate via the oxide thin film layer.

Moreover, in the first embodiment, a binder layer composed of a nanoparticle-fixed body containing only the nanoparticles 32 may be formed in place of the binder layer 30, and a layer containing the nanoparticles 31 may be provided between the binder layer thus formed and the substrate 50. In accordance with the wavelength conversion member with this configuration, a eutectic is generated between the binder layer and the layer containing the nanoparticles 31, and adhesion strength between the binder layer and the layer containing the nanoparticles 31 is enhanced.

EXAMPLES

Hereinafter, this embodiment will be described more in detail by examples; however, this embodiment is not limited to these examples.

Example 1

(Preparation of Mixed Solution)

First, YAG particles with an average particle size $D_{50}$ of approximately 20 μm was prepared as phosphor particles. Moreover, there was prepared a dispersion solution in which nanoparticles of molybdenum troxide with a particle size of 10 to 50 nm and nanoparticles of zinc oxide with a particle size of 10 to 50 nm were dispersed as nanoparticles. Next, the above-described YAG particles were added to such a nanoparticle dispersion liquid as described above, and an obtained mixture was kneaded, whereby a nanoparticle-mixed solution was prepared.

(Application of Nanoparticle-Mixed Solution)

A tape was mounted onto a metal substrate (substrate made of an aluminum alloy) to form low walls. The nanoparticle-mixed solution was dropped to a portion surrounded by the low walls, and the nanoparticle-mixed solution was applied using an applicator equipped with a bar coater.

(Formation of Wavelength Converter)

When the metal substrate applied with the nanoparticle-mixed solution was heated at 100° C. for 60 minutes, a dried body with a film thickness of 100 μm was obtained on the metal substrate. This dried body was formed as a wavelength converter including the YAG particles, and a binder layer that was composed of the nanoparticle-fixed body in which the nanoparticles of molybdenum troxide and the nanoparticles of zinc oxide were fixed to each other, the binder layer fixing the adjacent YAG particles to one another by the nanoparticle-fixed body. In this way, a wavelength conversion member in which the film-like wavelength converter with a thickness of 100 μm was formed on the metal substrate was obtained. Thereafter, this wavelength conversion member was subjected to a firing step of being heated at 450° C. for 2 hours, and then the wavelength conversion member in which the metal substrate and the wavelength converter were strongly fixed to each other without being peeled off from each other was obtained. No organic substance remained in the wavelength converter.

Comparative Example 1

(Preparation of Mixed Solution)

First, YAG particles with an average particle size $D_{50}$ of approximately 20 μm were prepared as phosphor particles. Moreover, as nanoparticles, a nanoparticle dispersion liquid of aluminum oxide with an average particle size $D_{50}$ of approximately 20 nm was prepared. Next, the above-described YAG particles were added to the nanoparticle dispersion liquid described above, and an obtained mixture was kneaded, whereby a nanoparticle-mixed solution was prepared.

(Application of Nanoparticle-Mixed Solution)

A tape was mounted onto a metal substrate to form low walls. The nanoparticle-mixed solution was dropped to a portion surrounded by the low walls, and the nanoparticle-mixed solution was applied using an applicator equipped with a bar coater.

(Formation of Wavelength Converter)

When the metal substrate applied with the nanoparticle-mixed solution was heated at 100° C. for 60 minutes, a dried body with a film thickness of 100 μm was obtained on the metal substrate. This dried body was formed as a wavelength converter including the YAG particles, and a binder layer that was composed of the nanoparticle-fixed body in which the nanoparticles of aluminum oxide were fixed to one another, the binder layer fixing the adjacent YAG particles to one another by the nanoparticle-fixed body. In this way, a wavelength conversion member in which the film-like wavelength converter with a thickness of 100 μm was formed on the metal substrate was obtained. Thereafter, this wavelength conversion member was subjected to a firing step of being heated at 450° C. for 60 minutes, and then the metal substrate and the wavelength converter were peeled off from each other.

As results of Example 1 and Comparative example 1, it was found that, when the nanoparticles constituting the binder layer were of specific types, the metal substrate and the wavelength converter were not peeled off from each other even if the firing step of burning down the organic substance in the binder layer was performed. Moreover, it was found that it was possible to fire the wavelength converter of Example 1 at a temperature as low as approximately 450° C.

Example 2

A wavelength conversion member was prepared in a similar way to Example 1 except using an AlN substrate in place of the metal substrate.

In the obtained wavelength conversion member, the AlN substrate and the wavelength converter were strongly fixed to each other without being peeled off from each other.

Example 3

A wavelength conversion member was prepared in a similar way to Example 2 except that the firing step of heating at 450° C. for 2 hours was not performed.

In the obtained wavelength conversion member, the AlN substrate and the wavelength converter were strongly fixed to each other without being peeled off from each other.

(Evaluation)

<Microscopy>

Figure 8:
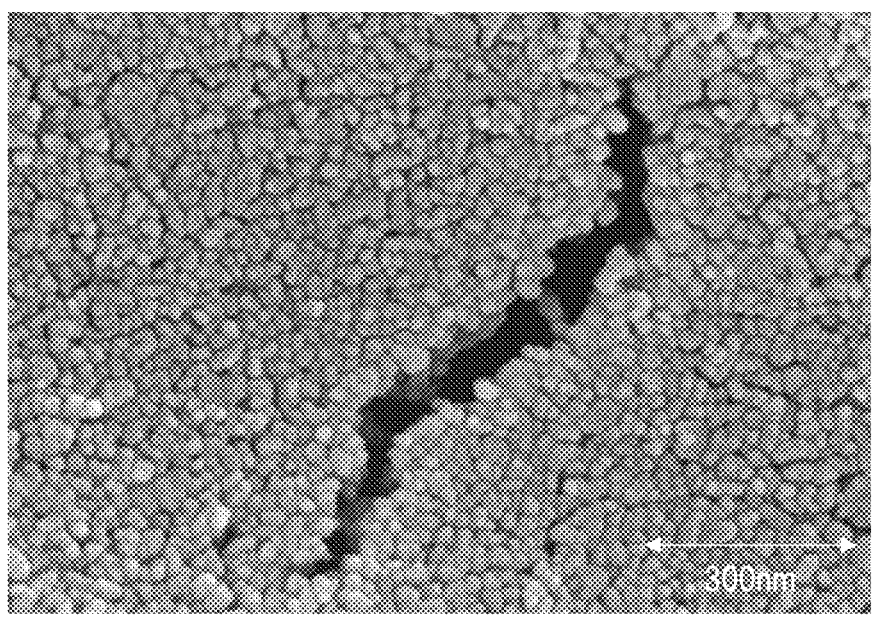
FIG. 8 is an example of a scanning electron microscope (SEM) picture of a surface of a binder layer, the surface having appeared on a fracture surface of a wavelength converter of a wavelength conversion member according to Example 3.

Fracture surfaces of the wavelength converters constituting the wavelength conversion members were observed by a scanning electron microscope (FE-SEM). FIG. 7 is an example of a scanning electron microscope (SEM) picture of a surface of the binder layer, the surface having appeared on the fracture surface of the wavelength converter of the wavelength conversion member according to Example 2. FIG. 8 is an example of a scanning electron microscope (SEM) picture of a surface of the binder layer, the surface having appeared on the fracture surface of the wavelength converter of the wavelength conversion member according to Example 3.

As shown in FIG. 7, the binder layer of the wavelength converter of Example 2 became a bulk body. Specifically, it was found out that the binder layer of Example 2 was not provided with the grain boundaries between the nanoparticles as a raw material, and became a bulk body with a configuration in which crystal structures with a particle size of several ten nanometers were continuous. Meanwhile, as shown in FIG. 8, it was found out that the binder layer of the wavelength converter in Example 3 became a nanoparticle-fixed body composed by fixing the plurality of nanoparticles to one another, in which cracks with a length of approximately 1000 nm were formed.

<Crystallinity Evaluation>

Figure 9:
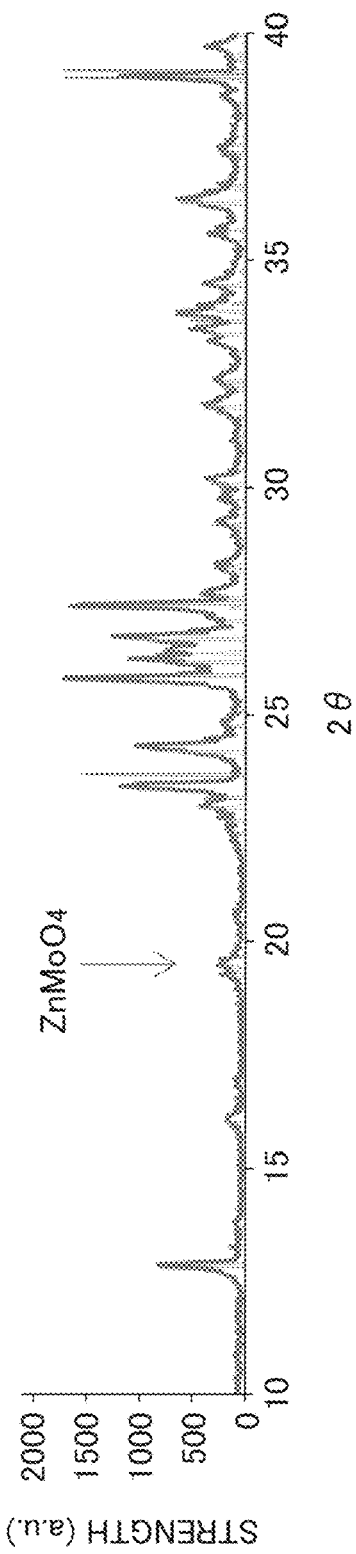
FIG. 9 is an example of an X-ray diffraction (XRD) evaluation result of the binder layer of the wavelength converter of the wavelength conversion member according to Example 2.
Figure 10:
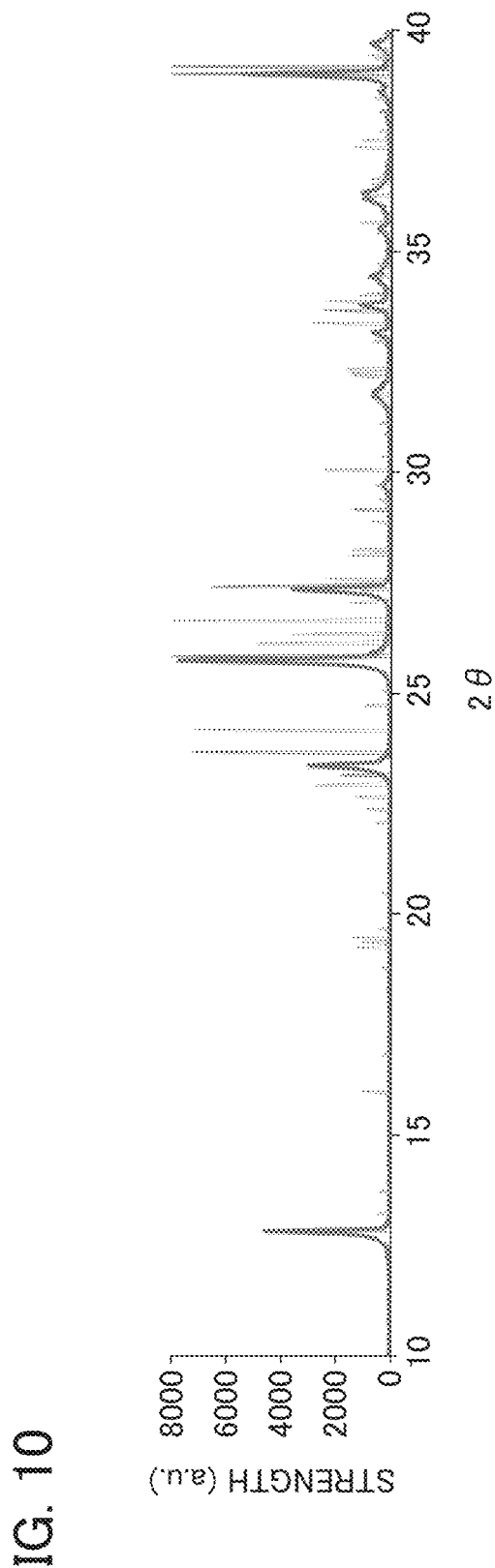
FIG. 10 is an example of an XRD evaluation result of the binder layer of the wavelength converter of the wavelength conversion member according to Example 3.

Using an X-ray diffraction (XRD) apparatus, XRD for the binder layers in Examples 2 and 3 was performed. FIG. 9 is an example of an XRD evaluation result of the binder layer of the wavelength converter of the wavelength conversion member according to Example 2. FIG. 10 is an example of an XRD evaluation result of the binder layer of the wavelength converter of the wavelength conversion member according to Example 3.

As shown in FIG. 9, in the binder layer in Example 2, a peak ascribed to $ZnMoO_4$ as a eutectic was confirmed. Meanwhile, as shown in FIG. 10, in the binder layer in Example 3, no peak ascribed to $ZnMoO_4$ as a eutectic was confirmed.

<Test of Irradiating Wavelength Conversion Member with Laser Beam>

Each of the wavelength conversion members according to Example 2 and Example 3 was pasted onto a metal-made heat sink. Next, a front surface side of the wavelength converter on the heat sink was irradiated with a laser beam with a central wavelength λ of 450 nm, and a surface temperature of the wavelength converter was measured by a thermal viewer. Then, a surface temperature $T_2$ (° C.) of the wavelength converter in Example 2 was divided by a surface temperature $T_3$ (° C.) of the wavelength converter in Example 3, whereby a relative value therebetween was calculated. Results are shown in Table 1.

TABLE 1

| | Wavelength Converter | | | | Evaluation Relative Value |
|---|---|---|---|---|---|
| | | Film | Firing Condition after Drying at 100° C. | | of Surface Temperature (° C.) of |
| | Substrate Material | Thickness (μm) | Temperature (° C.) | Time (Hr) | Wavelength Converter |
| Example 2 | AlN | 100 | 450 | 2 | 0.85 |
| Example 3 | AlN | 100 | Not Fired | Not Fired | 1.00 |

From Table 1, it was found that the wavelength converter of Example 2 had higher heat dissipation than the wavelength converter of Example 3. Moreover, it was found that it was possible to fire the wavelength converter of Example 2 at a temperature as low as approximately 450° C.

The entire contents of Japanese Patent Application No. 2016-079354 (filed on: Apr. 12, 2016) are incorporated herein by reference.

Although the contents of this embodiment have been described above in accordance with the examples, it is obvious to those skilled in the art that this embodiment is not limited to the description of these and that various modifications and improvements are possible.

INDUSTRIAL APPLICABILITY

The wavelength conversion member according to the present invention is excellent in heat resistance and heat dissipation even when irradiated with the high-power excitation light, has high adhesion between the substrate and the wavelength converter, and is capable of being fired at low temperature.

REFERENCE SIGNS LIST

1: WAVELENGTH CONVERSION MEMBER
10: WAVELENGTH CONVERTER
20: INORGANIC PHOSPHOR PARTICLE (YAG PARTICLE)
30: BINDER LAYER
31: NANOPARTICLE (NANOPARTICLE OF METAL OXIDE WITH MELTING POINT OF 800° C. OR LESS)
32: NANOPARTICLE (NANOPARTICLE OTHER THAN NANOPARTICLE OF METAL OXIDE WITH MELTING POINT OF 800° C. OR LESS)
35: AIR GAP
40: NANOPARTICLE-COVERED PHOSPHOR PARTICLE
50: SUBSTRATE

The invention claimed is:

1. A wavelength conversion member comprising:
a substrate; and
a wavelength converter that converts color of incident light, the wavelength converter being provided on a surface of the substrate,
wherein the wavelength converter includes:
inorganic phosphor particles which convert the color of the incident light; and
a binder layer that fixes the inorganic phosphor particle to one another, the binder layer including molybdenum trioxide and zinc oxide, wherein the binder layer is a bulk body comprising a polycrystal including $ZnMoO_4$, which is a eutectic material of the molybdenum trioxide and the zinc oxide; and the substrate and the wavelength converter are fixed to each other by the binder layer of the wavelength converter.

2. The wavelength conversion member according to claim 1, wherein the bulk body further includes boron nitride.

3. The wavelength conversion member according to claim 1, wherein the substrate is a metal substrate.

* * * * *